United States Patent
Gan et al.

(10) Patent No.: US 7,157,323 B2
(45) Date of Patent: Jan. 2, 2007

(54) METHODS FOR FABRICATING THIN FILM TRANSISTORS

(75) Inventors: Feng-Yuan Gan, Hsinchu (TW); Han-Tu Lin, Wuci Township, Taichung County (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 11/142,930

(22) Filed: Jun. 2, 2005

(65) Prior Publication Data

US 2006/0110871 A1    May 25, 2006

(30) Foreign Application Priority Data

Nov. 22, 2004   (TW) .............................. 93135857 A

(51) Int. Cl.
*H01L 21/336*   (2006.01)
*H01L 21/8234*  (2006.01)
*H01L 21/00*    (2006.01)
*H01L 21/84*    (2006.01)

(52) U.S. Cl. ...................... 438/197; 438/275; 438/154; 438/149

(58) Field of Classification Search ................ 438/197, 438/275, 154, 149
See application file for complete search history.

(56) References Cited

U.S. PATENT DOCUMENTS

| 6,165,917 | A   |   | 12/2000 | Batey et al. ................ 438/792 |
| 6,900,464 | B1  | * | 5/2005  | Doi et al. ...................... 257/72 |
| 6,939,768 | B1  | * | 9/2005  | Jeng ............................ 438/299 |
| 2002/0042167 | A1 |  | 4/2002  | Chae ........................... 438/149 |

* cited by examiner

*Primary Examiner*—Chuong Anh Luu
(74) *Attorney, Agent, or Firm*—Thomas, Kayden, Horstemeyer & Risley

(57) ABSTRACT

Fabrication methods for thin film transistors. A metal gate stack structure is formed on an insulating substrate. The substrate is performed using thermal annealing to create an oxide layer on the sidewalls of the metal gate stack structure. A gate insulating layer is formed on the substrate covering the metal gate stack structure. A semiconductor layer is formed on the gate insulating layer. A source/drain layer is formed on the semiconductor.

30 Claims, 7 Drawing Sheets

METHODS FOR FABRICATING THIN FILM TRANSISTORS

BACKGROUND

The invention relates to methods for fabricating thin film transistors, and more particularly, to methods for fabricating gate structures of thin film transistors.

Bottom-gate type thin film transistors (TFTs) are widely used in thin film transistor liquid crystal displays (TFT-LCDs). FIG. 1A is a cross section of a conventional bottom-gate type TFT structure 100. The TFT structure 100 typically comprises a glass substrate 110, a metal gate 120, a gate insulating layer 130, a channel layer 140, an ohmic contact layer 150, a source 160 and a drain 170.

As the size of TFT-LCD panels increases, metals having low resistance are required. For example, gate lines-employ low resistance metals such as Cu and Cu alloy in order to improve operation of the TFT-LCD. Cu, however, has unstable properties such as poor adhesion to the glass substrate, which can cause a film peeling problem. Cu also has a tendency to diffuse into a silicon film and must be mixed with other metals such as Cr or Mg to increase the resistance thereof. Moreover, Cu is vulnerable to deformation. Specifically, in a plasma process of depositing a film, characteristic degradation such as roughness and resistance of Cu are increased due to reaction between Cu and the plasma during plasma enhanced chemical vapor deposition (PECVD).

U.S. Pat. No. 6,165,917 to Batey et al., the entirety of which is hereby incorporated by reference, discloses a method for passivating Cu layer. The method uses an ammonia-free silicon nitride layer as a cap layer covering a Cu gate.

U.S. Publication No. 2002/0042167 to Chae, the entirety of which is hereby incorporated by reference, discloses a method for forming a TFT. A metal layer such as Ta, Cr, Ti, or W is deposited on a substrate. A Cu gate is defined on the metal layer. Thermal oxidation is then performed to diffuse the material of the metal layer along the surface of the Cu gate, which is consequently surrounded by a metallic oxide.

FIG. 1B is a cross section of a conventional bottom-gate type TFT structure 100a. A metal gate 120 comprising a doped copper alloy or a solid solution copper alloy is formed on a glass substrate 110. Dopant or solute in the metal gate 120 diffuses to the surface of the metal gate 120 by heat treatment. An oxide layer 125 is formed after oxidation covering the metal gate 120. Resistivity $R_s$ of the metal gate 120 comprising a doped copper alloy or a solid solution copper alloy is, however, very high and typically in a range of 4–8 μΩ·cm. As such, high resistivity cannot meet requirements for TFT devices.

SUMMARY

Accordingly, the invention provides methods for fabricating thin film transistors by employing multi-layered metal gate stack structure and forming an oxide layer on sidewalls thereof, thereby improving adhesion between metal gate stack structure and a glass substrate. Furthermore, with the oxide layer passivation, the metal gate stack structure is protected from damage during subsequent plasma process. Most importantly, resistivity of the metal gate stack structure is kept very low.

The invention provides a method for fabricating a thin film transistor (TFT), comprising forming a first doped metal layer with a dopant material on an insulating substrate, forming a second metal layer on the first doped metal layer, patterning the first doped metal layer and the second metal layer to form a metal gate stack structure, oxidizing the metal gate structure to form an oxide layer covering the sidewalls thereof, diffusing the first and the second dopant materials to sidewalls of the metal gate stack structure, forming a gate insulating layer overlying the insulating substrate and the metal gate stack structure, forming a silicon-containing semiconductor layer overlying the gate insulating layer, and forming a source and a drain overlying the silicon containing semiconductor layer.

The invention also provides a method for fabricating a thin film transistor (TFT), comprising forming a first doped metal layer with a first dopant material on an insulating substrate, forming a second metal layer on the first doped metal layer, forming a third doped metal layer with a second dopant material on the second layer, patterning the first doped metal layer, the second metal layer, and the third doped metal layer to form a metal gate stack structure, oxidizing the metal gate stack structure to form an oxide layer covering the sidewalls thereof, diffusing the dopant material to sidewalls of the metal gate stack structure, forming a gate insulating layer overlying the insulating substrate and the metal gate stack structure, forming a silicon-containing semiconductor layer overlying the gate insulating layer, and forming a source and a drain overlying the silicon containing semiconductor layer.

DESCRIPTION OF THE DRAWINGS

The invention can be more fully understood by reading the subsequent detailed description in conjunction with the examples and references made to the accompanying drawings, wherein.

DETAILED DESCRIPTION

First Embodiment

Figure 1A:
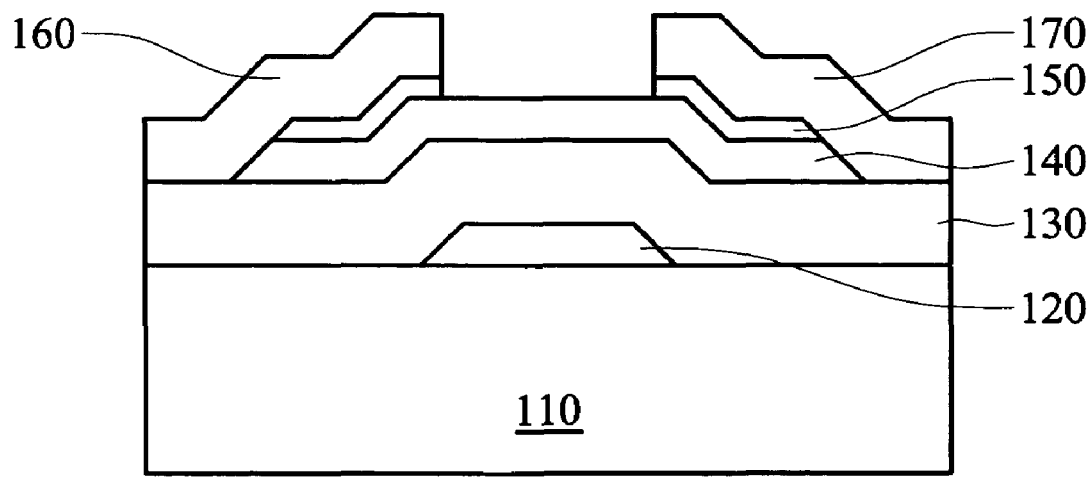
FIG. 1A is a cross section of a conventional bottom-gate type TFT structure.
Figure 1B:
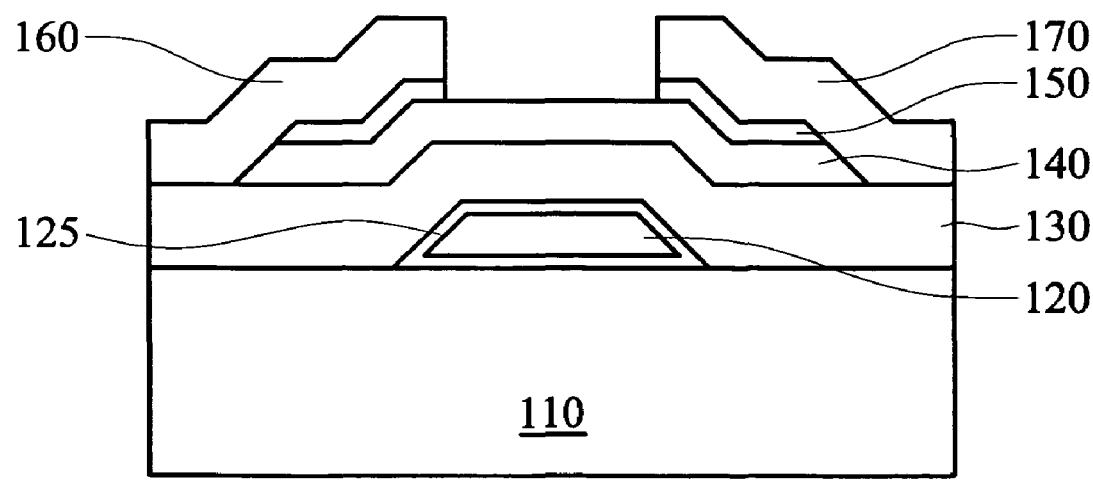
FIG. 1B is a cross section of a conventional bottom-gate type TFT structure.
Figure 2A:
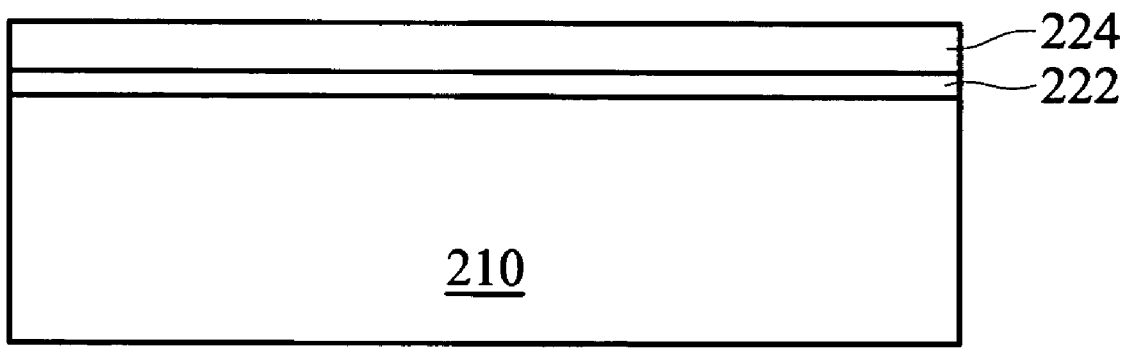
FIGS. 2A–2E are cross sections of methods for fabricating a thin film transistor according to a first embodiment of the invention.

FIGS. 2A–2E are cross sections of methods for fabricating a thin film transistor according to a first embodiment of the invention. Referring to FIG. 2A, a first doped metal layer 222 is formed on an insulating substrate 210 of, for example, glass or quartz. The first doped metal layer 222 can be a copper alloy with dopants comprising Mo, Cr, Ti, W, Ta, Mg, Nd, Zr, Al, Ni, or combinations thereof. Alternatively, the first doped metal layer 222 can be a silver alloy with dopants comprising Li, Mg, Al, Sm, Pd, Au, Cu, or combinations thereof. The first doped metal layer 222 is deposited by chemical vapor deposition (CVD) or physical vapor deposition (PVD) at a range of approximately 500 to 1000 Å. Next, a second metal layer 224 is formed on the first doped metal substrate 222. The second metal layer 224 comprises Cu, Ag, Al, Ag—Pd—Cu, or alloys thereof. The second metal layer 224 is deposited by CVD or PVD at a range of approximately 1000 to 4000 Å. The first doped metal layer 222 and the second metal layer 224 are formed in a single vacuum chamber and a single vacuum step. The requirement for resistivity $R_s$ of the second metal layer 224 is approximately 1.5 to 6 μΩ·cm.

Figure 2B:
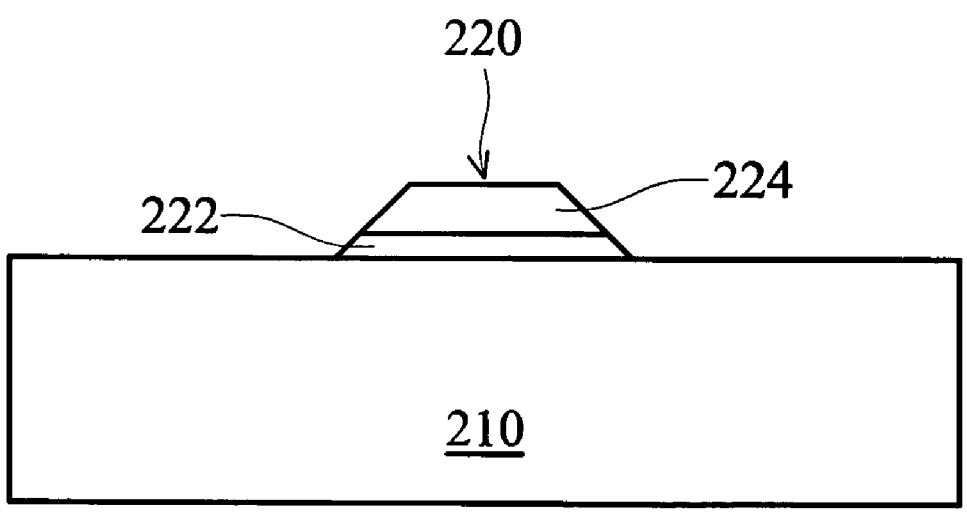

Referring to FIG. 2B, the first doped metal layer 222 and the second metal layer 224 are patterned by conventional lithography and etching to form a metal gate stack structure 220. Patterning of the first doped metal layer 222 and the second metal layer 224 comprises etching the first doped metal layer 222 and the second metal layer 224 to form tapered sidewalls, providing excellent step-coverage for subsequent layer formation. Note that the first doped metal layer 222 serves as an adhesion layer, thereby improving adhesion between the metal gate stack structure 220 and the insulating substrate 210.

Figure 2C:
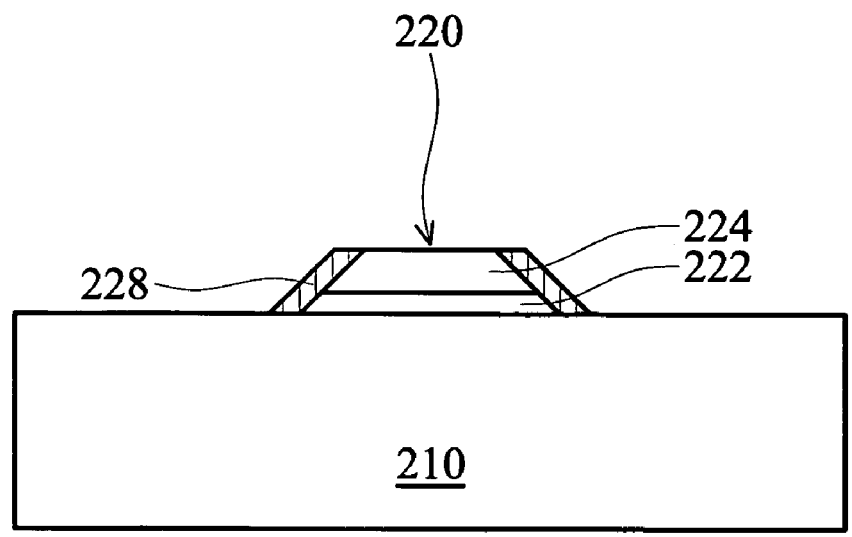

Referring to FIG. 2C, an oxide 228 is formed by thermal process. The metal gate stack structure 220 is annealed, during which dopants in the metal gate stack structure 220 diffuse to the surface of the metal gate stack structure 200 and oxidize to form an oxide layer 228 covering sidewalls of the metal gate stack structure 220. The oxide layer 228 can comprise molybdenum oxide, chromium oxide, titanium oxide, tungsten oxide, tantalum oxide, neodymium oxide, zirconium oxide, aluminum oxide, samarium oxide, palladium oxide, magnesium oxide, lithium oxide, nickel oxide, or combinations thereof. The oxide layer 228 is at least approximately 30 nm thick.

Figure 2D:
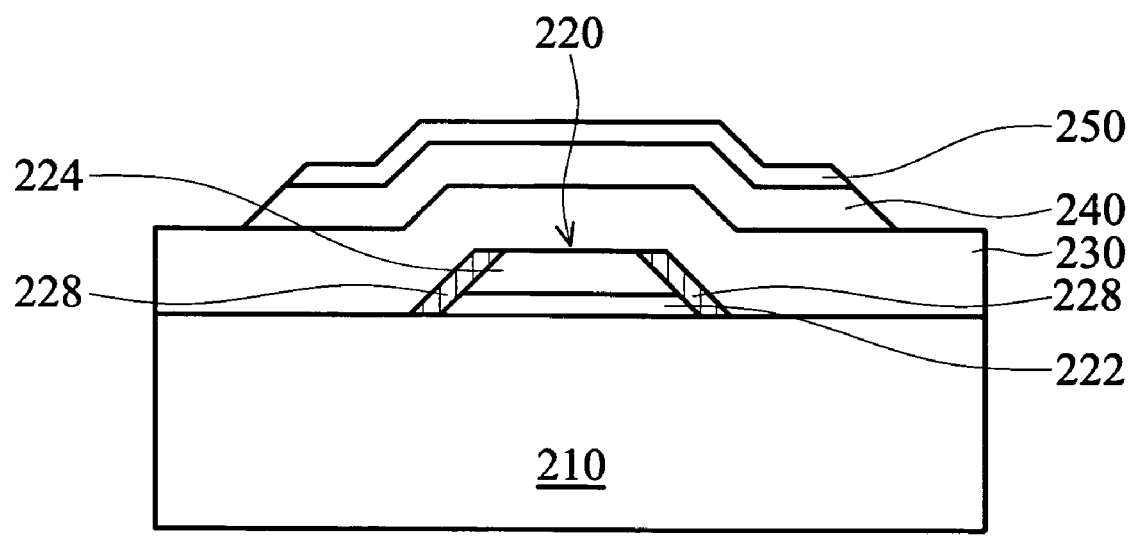

Referring to FIG. 2D, a gate insulating layer 230 is subsequently formed over the insulating substrate 210 covering the metal gate stack structure 220 and the oxide layer 228, by, for example, plasma enhanced chemical vapor deposition. The gate insulating layer 230 can comprise silicon oxide, silicon nitride, silicon oxynitride, tantalum oxide or aluminum oxide.

Referring to FIG. 2D again, a silicon-containing semiconductor layer 240 is formed on the gate insulating layer 230, comprising polysilicon, amorphous silicon, or impurity-added silicon formed by CVD. An ohmic contact layer 250 can optionally be formed on the silicon containing semiconductor layer. The silicon containing semiconductor 240 and the ohmic contact layer 250 are patterned by conventional lithography and etching to form a channel 240 and the ohmic contact layer 250. The ohmic contact layer 250 can comprise n-type doped silicon, for example, phosphorous-doped or arsenide-doped silicon.

Figure 2E:
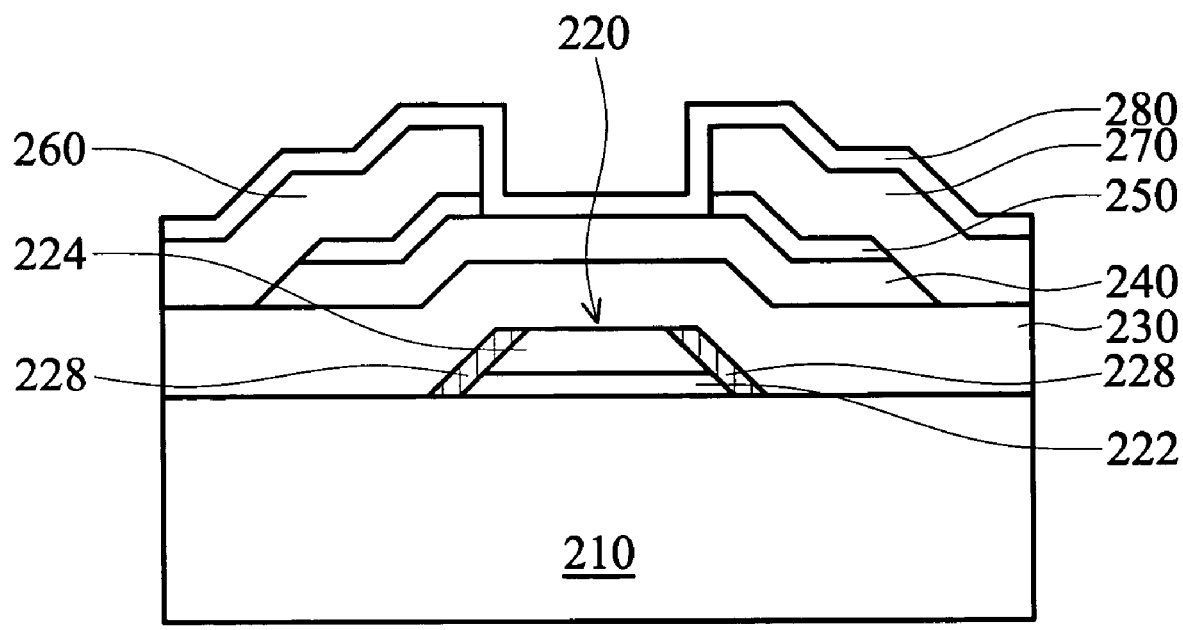

Referring to FIG. 2E, a metal layer is formed on the ohmic contact layer 250 and the gate insulating layer 230, comprising Al, Mo, Cr, W, Ta, Ti, Ni, or combinations thereof formed by sputtering. The metal layer is patterned to form a source 260 and a drain 270 exposing the ohmic contact layer 250. The exposed ohmic contact layer 250 is etched using the source 260 and the drain 270 as masks. Next, a passivation layer 280 is conformably formed over the insulating substrate 210. A thin film transistor is thus formed.

Note that when the TFT structure is applied in a thin film transistor liquid crystal display panel, the metal gate stack structure 220 and the gate line (not shown) of an array substrate can be formed simultaneously. Thus, the first doped metal layer 222 can also be disposed between the gate line and the insulating substrate 210. To avoid obscuring aspects of the disclosure, description of detailed formation of the TFT-LCD panel is omitted here.

Second Embodiment

Figure 3A:
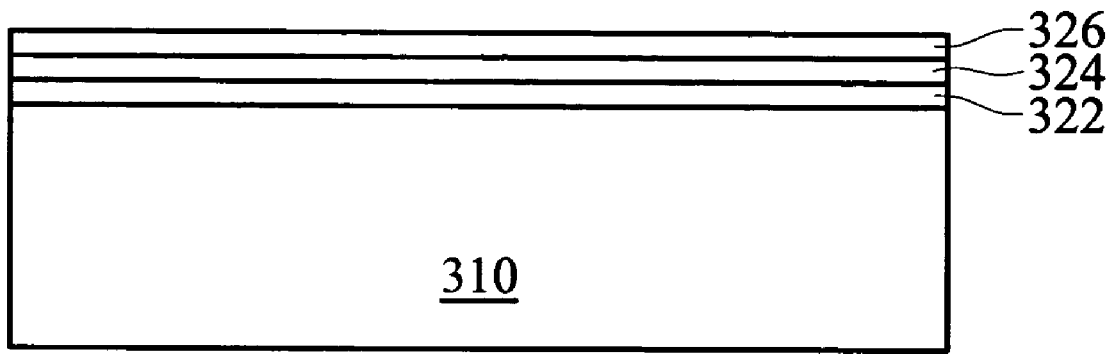
FIGS. 3A–3E are cross sections of a method for fabricating a thin film transistor according to a second embodiment of the invention.

FIGS. 3A–3E are cross sections of a method for fabricating a thin film transistor according to a second embodiment of the invention. Referring to FIG. 3A, a first doped metal layer 322 is formed on an insulating substrate 310 of, for example, glass or quartz. The first doped metal layer 322 can be a copper alloy with dopants comprising Mo, Cr, Ti, W, Ta, Mg, Nd, Zr, Al, Ni, or combinations thereof. Alternatively, the first doped metal layer 322 can be a silver alloy with dopants comprising Li, Mg, Al, Sm, Pd, Au, Cu, or combinations thereof. The first doped metal layer 322 is deposited by chemical vapor deposition (CVD) or physical vapor deposition (PVD) at a range of approximately 500 to 1000 Å. Next, a second metal layer 324 is formed on the first doped metal substrate 322, comprising Cu, Ag, Al, Ag—Pd—Cu, or alloys thereof. The second metal layer 324 is deposited by CVD or PVD at a range of approximately 1000 to 4000 Å. The first doped metal layer 322 and the second metal layer 324 are formed in a single vacuum chamber and a single vacuum step. The requirement for resistivity $R_s$ of the second metal layer 324 is approximately 1.5 to 6 μΩ·cm.

Next, a third doped metal layer 326 is formed on the second metal layer 324 of a copper alloy with dopants comprising Mo, Cr, Ti, W, Ta, Mg, Nd, Zr, Al, Ni, or combinations thereof. Alternatively, the third doped metal layer 326 can be a silver alloy with dopants comprising Li, Mg, Al, Sm, Pd, Au, Cu, or combinations thereof. The third doped metal layer 326 is deposited by chemical vapor deposition (CVD) or physical vapor deposition (PVD) at a range of approximately 500 to 1000 Å. The first doped metal layer 322, the second metal layer 324, and the third doped metal layer 326 are formed in a single vacuum chamber and a single vacuum step.

Figure 3B:
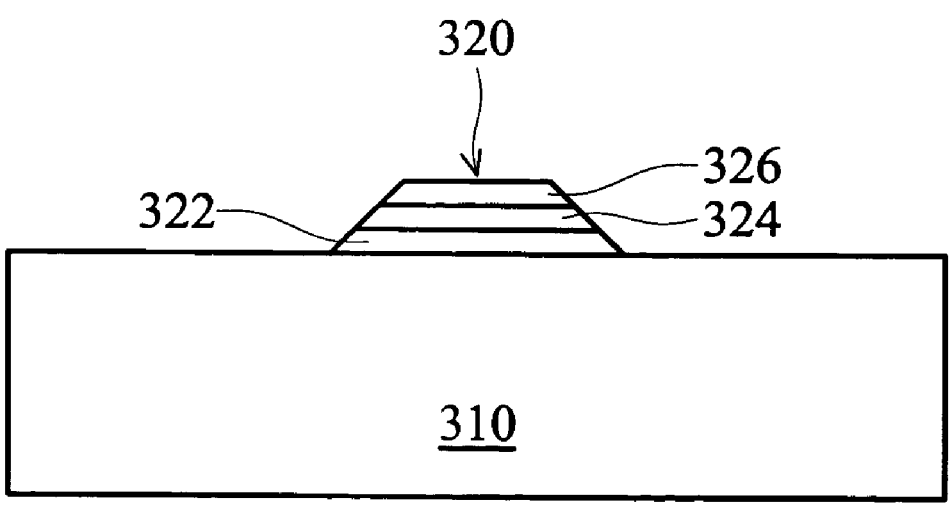

Referring to FIG. 3B, the first doped metal layer 322, the second metal layer 324, and the third doped metal layer 326 are patterned by conventional lithography and etching to form a metal gate stack structure 320. Patterning of the first doped metal layer 322, the second metal layer 324, and the third doped metal layer 326 comprising etching the first doped metal layer 322, the second metal layer 324, and the third doped metal layer 326 to form tapered sidewalls providing excellent step-coverage for subsequent layer formation. Note that the first doped metal layer 322 serves as an adhesion layer, thereby improving adhesion between the metal gate stack structure 320 and the insulating substrate 310. Moreover, the third doped metal layer 326 can protect the second metal layer 324 from damage to subsequently plasma process.

Figure 3C:
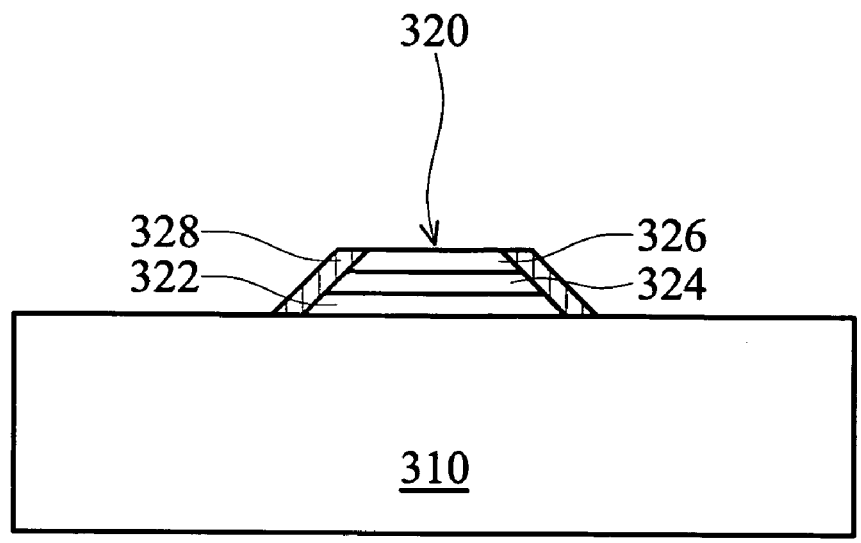

Referring to FIG. 3C, an oxide 328 is formed by thermal process. The metal gate stack structure 320 is annealed, during which dopants in the metal gate stack structure 320 diffuses to surface of the metal gate stack structure 300 and oxidize to form an oxide layer 328 covering sidewalls of the metal gate stack structure 320. The oxide layer 328 can comprise molybdenum oxide, chromium oxide, titanium oxide, tungsten oxide, tantalum oxide, neodymium oxide, zirconium oxide, aluminum oxide, samarium oxide, palladium oxide, magnesium oxide, lithium oxide, nickel oxide, or combinations thereof. The oxide layer 328 is at least approximately 30 nm thick.

Figure 3D:
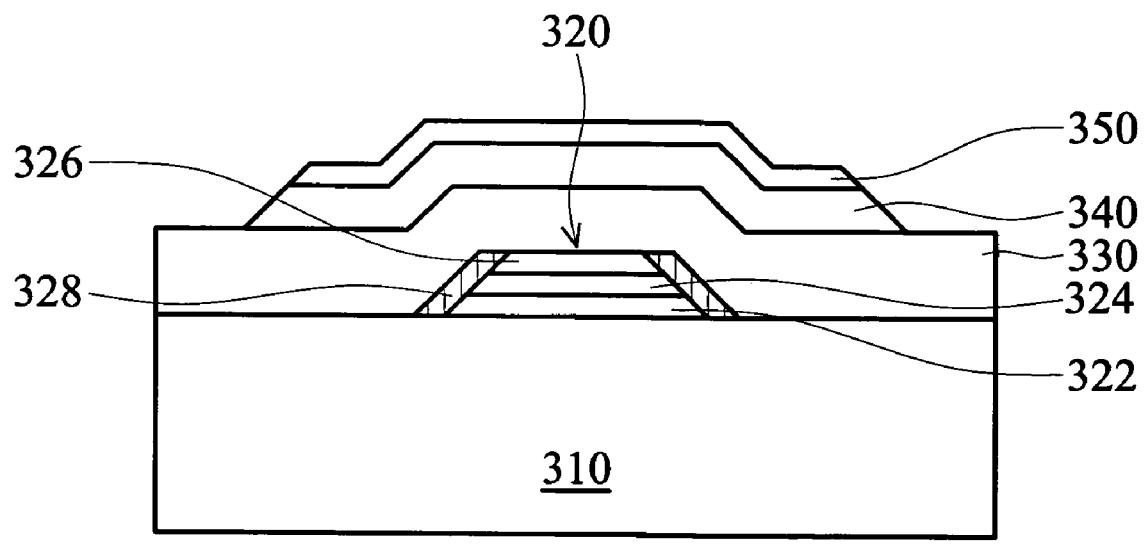

Referring to FIG. 3D, a gate insulating layer 330 is subsequently formed over the insulating substrate 310 covering the metal gate stack structure 320 and the oxide layer 328, by, for example, plasma enhanced chemical vapor deposition. The gate insulating layer 330 can comprise silicon oxide, silicon nitride, silicon oxynitride, tantalum oxide or aluminum oxide.

Referring to FIG. 3D again, a silicon-containing semiconductor layer 340 is formed over the gate insulating layer 330, comprising polysilicon, amorphous silicon, or impurity-added silicon formed by CVD. An ohmic contact layer 350 can optionally be formed on the silicon containing semiconductor layer. The silicon containing semiconductor 340 and the ohmic contact layer 350 are patterned by conventional lithography and etching to form a channel 340 and the ohmic contact layer 350. The ohmic contact layer 350 can comprise n-type doped silicon, for example, phosphorous-doped or arsenide-doped silicon.

Figure 3E:
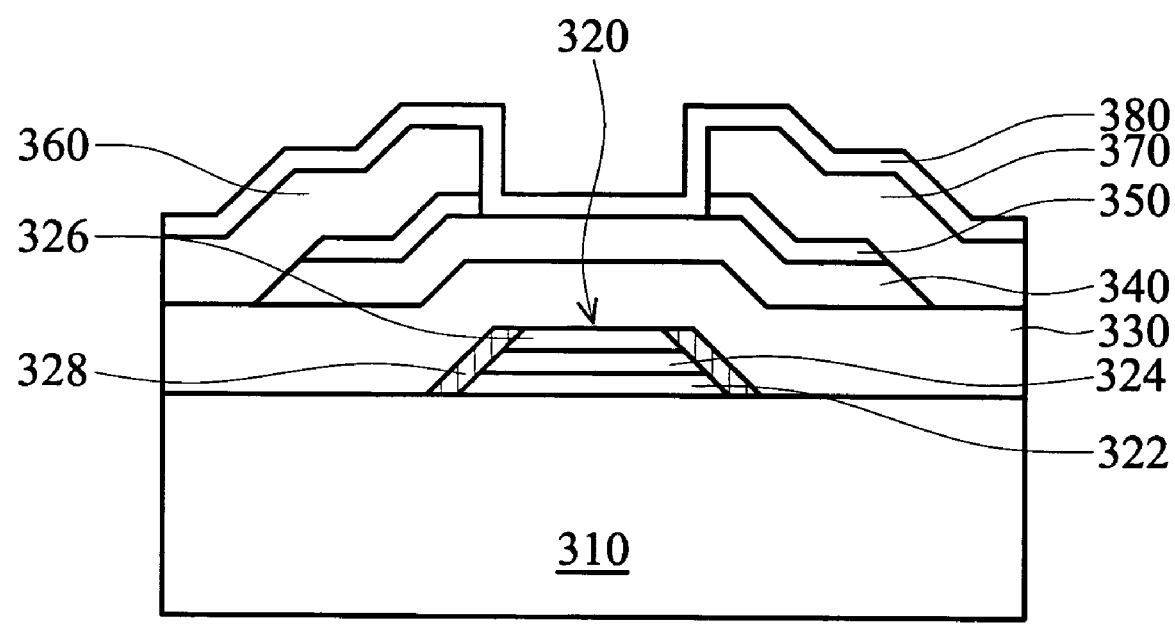

Referring to FIG. 3E, a metal layer is formed on the ohmic contact layer 350 and the gate insulating layer 330, comprising Al, Mo, Cr, W, Ta, Ti, Ni, or combinations thereof formed by sputtering. The metal layer is patterned to form a source 360 and a drain 370 exposing the ohmic contact layer 350. The exposed ohmic contact layer 350 is etched using the source 360 and the drain 370 as masks. Next, a passivation layer 380 is conformably formed over the insulating substrate 310. A thin film transistor is thus formed.

Note that when the TFT structure is applied in a thin film transistor liquid crystal display panel, the metal gate stack structure 320 and the gate line (not shown) of an array substrate can be formed simultaneously. Thus, the first doped metal layer 322 can also be disposed between the gate line and the insulating substrate 310. To avoid obscuring aspects of the disclosure, description of detailed formation of the TFT-LCD panel is omitted here.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for fabricating a thin film transistor (TFT), comprising:
   forming a first doped metal layer with a dopant material overlying an insulating substrate;
   forming a second metal layer overlying the first doped metal layer;
   patterning the first doped metal layer and the second metal layer to form a metal gate stack structure;
   diffusing the dopant material to sidewalls of the metal gate stack structure;
   oxidizing the metal gate stack structure to form an oxide layer covering the sidewalls thereof;
   forming a gate insulating layer overlying the insulating substrate and the metal gate stack structure;
   forming a silicon-containing semiconductor layer substantially only overlying the gate insulating layer; and
   forming a source and a drain overlying the silicon containing semiconductor layer.

2. The method as claimed in claim 1, wherein the first doped metal layer comprises a copper alloy with dopants of Mo, Cr, Ti, W, Ta, Mg, Nd, Zr, Al, Ni, or combinations thereof.

3. The method as claimed in claim 1, wherein the first doped metal layer comprises a silver alloy with dopants of Li, Mg, Al, Sm, Pd, Au, Cu, or combinations thereof.

4. The method as claimed in claim 1, wherein the second metal layer comprises Cu, Ag, Al, Ag—Pd—Cu, or alloys thereof.

5. The method as claimed in claim 1, wherein the first doped metal layer and the second metal layer are formed in a single vacuum chamber and with a single vacuum step.

6. The method as claimed in claim 1, wherein patterning of the first doped metal layer and the second metal layer comprises etching the first doped metal layer and the second metal layer to form tapered sidewalls.

7. The method as claimed in claim 1, wherein the oxide layer comprises an oxide released by heating the first doped metal layer.

8. The method as claimed in claim 1, wherein the oxide layer is formed by a thermal process to a thickness of about 30 nm.

9. The method as claimed in claim 1, wherein the gate insulating layer comprises a silicon oxide, a silicon nitride, a silicon oxynitride, a tantalum oxide or an aluminum oxide.

10. The method as claimed in claim 1, wherein the source and the drain comprise Al, Mo, Cr, W, Ta, Ti or Ni.

11. The method as claimed in claim 1, wherein the silicon-containing semiconductor is a channel layer.

12. The method as claimed in claim 1, wherein an ohmic contact layer is formed between the silicon containing semiconductor and a source and a drain.

13. The method as claimed in claim 1, farther comprising forming a passivation layer over the insulating substrate.

14. A method for fabricating a thin film transistor (TFT), comprising:
   forming a first doped metal layer with a first dopant material on an insulating substrate;
   forming a second metal layer on the first doped metal layer;
   forming a third doped metal layer with a second dopant material on the second layer;
   patterning the first doped metal layer, the second metal layer, and the third doped metal layer to form a metal gate stack structure;
   diffusing the first and the second dopant materials to sidewalls of the metal gate stack structure;
   oxidizing the metal gate structure to form an oxide layer substantially only covering the sidewalls thereof;
   forming a gate insulating layer overlying the insulating substrate and the metal gate stack structure;
   forming a silicon-containing semiconductor layer overlying the gate insulating layer; and
   forming a source and a drain overlying the silicon containing semiconductor layer.

15. The method as claimed in claim 14, wherein the first doped metal layer comprises a copper alloy with dopants of Mo, Cr, Ti, W, Ta, Mg, Nd, Zr, Al, Ni, or combinations thereof.

16. The method as claimed in claim 14, wherein the first doped metal layer comprises a silver alloy with dopants of Li, Mg, Al, Sm, Pd, Au, Cu, or combinations thereof.

17. The method as claimed in claim 14, wherein the second metal layer comprises Cu, Ag, Al, Ag—Pd—Cu, or alloys thereof.

18. The method as claimed in claim 14, wherein the third doped metal layer comprises a copper alloy with dopants of Mo, Cr, Ti, W, Ta, Mg, Nd, Zr, Al, Ni, or combinations thereof.

19. The method as claimed in claim 14, wherein the third doped metal layer comprises a silver alloy with dopants of Li, Mg, Al, Sm, Pd, Au, Cu, or combinations thereof.

20. The method as claimed in claim 14, wherein the first doped metal layer, the second metal layer, and the third doped metal layer are formed in a single vacuum chamber and with a single vacuum step.

21. The method as claimed in claim 14, wherein patterning the first doped metal layer, the second metal layer, and the third doped metal layer comprises etching the first doped metal layer, the second metal layer, and the third doped metal layer to form tapered sidewalls.

22. The method as claimed in claim 14, wherein the oxide layer comprises an oxide released by heating the first doped metal layer and the third doped metal layer.

23. The method as claimed in claim 14, wherein the oxide layer is formed by a thermal process to a thickness of about 30 nm.

24. The method as claimed in claim 14, wherein the gate insulating layer comprises a silicon oxide, a silicon nitride, a silicon oxynitride, a tantalum oxide, an aluminum oxide, or combinations thereof.

25. The method as claimed in claim 14, wherein the source and the drain comprise Al, Mo, Cr, W, Ta, Ti or Ni.

26. The method as claimed in claim 14, wherein the silicon-containing semiconductor is a channel layer.

27. The method as claimed in claim 14, wherein an ohmic contact layer is formed between the silicon-containing semiconductor and a source and a drain.

28. The method as claimed in claim 14, further comprising forming a passivation layer over the insulating substrate.

29. A method for fabricating a thin film transistor (TFT), comprising:

forming a first doped metal layer with a dopant material overlying an insulating substrate;

forming a second metal layer overlying the first doped metal layer;

patterning the first doped metal layer and the second metal layer to form a metal gate stack structure; oxidizing the metal gate structure to form an oxide layer substantially only covering the sidewalls thereof;

forming a gate insulating layer overlying the insulating substrate and the metal gate stack structure;

forming a silicon-containing semiconductor layer overlying the gate insulating layer; and forming a source and a drain overlying the silicon containing semiconductor layer.

30. The method as claimed in claim 14, further comprising forming a third doped metal layer with a second dopant material on the second layer and patterning the first doped metal layer, the second metal layer, and the third doped metal layer to form a metal gate stack structure.

* * * * *